(12) United States Patent
Lourens (10) Patent No.: US 7,263,138 B2
(45) Date of Patent: Aug. 28, 2007

(54) Q-QUENCHING SUPER-REGENERATIVE RECEIVER

(75) Inventor: Ruan Lourens, Chandler, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 764 days.

(21) Appl. No.: 10/670,619

(22) Filed: Sep. 25, 2003

(65) Prior Publication Data
US 2005/0069051 A1  Mar. 31, 2005

(51) Int. Cl.
*H04L 27/06* (2006.01)
(52) U.S. Cl. .................. 375/316; 331/16; 455/258; 455/259
(58) Field of Classification Search ................. 375/316; 329/302; 331/16
See application file for complete search history.

(56) References Cited

U.S. PATENT DOCUMENTS

| | | | | |
|---|---|---|---|---|
| 4,786,903 | A * | 11/1988 | Grindahl et al. | 340/10.4 |
| 5,630,216 | A * | 5/1997 | McEwan | 455/215 |
| 5,751,197 | A | 5/1998 | Boling, III | 331/107 A |
| 5,986,600 | A * | 11/1999 | McEwan | 342/28 |
| 6,035,002 | A * | 3/2000 | Schleifer | 375/318 |
| 6,487,264 | B1 * | 11/2002 | Alley et al. | 375/361 |
| 7,046,122 | B1 * | 5/2006 | Forster | 340/10.33 |
| 2002/0093389 | A1 * | 7/2002 | Midtgaard | 331/158 |
| 2004/0198288 | A1 * | 10/2004 | Sadowski | 455/259 |

OTHER PUBLICATIONS

Notification of Transmittal of the International Search Report and Written Opinion for PCT/US2004/030627, 11 pgs, Mailed Jan. 27, 2005.
Dietz, G. et al., *A 10-14 GHZ Quenchable MMIC Oscillator*, Microwave and Millimeter-Wave Monolithic circuits Symposium, pp. 23-26, Jun. 10, 1991.

* cited by examiner

*Primary Examiner*—Curtis Odom
(74) *Attorney, Agent, or Firm*—Baker Botts L.L.P.

(57) ABSTRACT

A super-regenerative receiver uses controlled Q-quenching and may limit the resonant tank circuit amplitude by loading the tank circuit as soon as regenerative oscillation is detected. An amplitude detector is coupled to the regenerative amplifier and controls a Q loading circuit coupled to the tank circuit of the regenerative amplifier. The amplitude detector turns on the Q loading circuit which then stops the regenerative amplifier from oscillating, and the Q-loading remains on for a brief time to insure that the regenerative amplifier has stopped oscillating. After the brief time, the Q loading circuit is turned off and the regenerative amplifier goes into oscillation again. This cycle repeats controllably over and over, resulting in a lower self-induced noise floor and improved received signal sensitivity. The super-regenerative receiver may be used in the very low frequency (VLF), low frequency (LF), medium frequency (MF), high frequency (HF), very high frequency (VHF) and super high frequency (SHF) ranges to receive continuous wave (CW), amplitude modulated (AM) and frequency modulated (FM) radio signals.

30 Claims, 7 Drawing Sheets

Q-QUENCHING SUPER-REGENERATIVE RECEIVER

FIELD OF THE INVENTION

The present invention relates generally to radio frequency receivers, and more particularly to low power and cost super-regenerative receivers.

BACKGROUND OF THE INVENTION TECHNOLOGY

The market for low cost and sensitive radio frequency receivers is enormous and current technology solutions are fairly expensive. Low frequency (LF) receivers are used for self-setting clocks that receive the National Institute of Standards and Technology (NIST) WWVB time information and are used in high-end consumer and industrial applications. The cost of such receivers keep this technology out of the mass markets such as energy metering and lower end consumer electronics.

Various radio frequencies are used to transmit this time standard. The NIST radio station WWVB transmits at a very low frequency (VLF) of 60 kHz and effectively distributes standard time information to better than one second throughout the North American continent. Other VLF time standard transmitting sites are in the far east—JJY (Japan) and Europe—MSF (UK). NIST WWV also transmits time information in the high frequency (HF) radio spectrum.

The NIST radio stations (e.g., WWV, WWVH, WWVB) are continuously being used for both precise frequency and time calibration, The demand for precise frequency and time calibration is constantly growing as manufacturers continue to create new, lower cost products, in an effort to place "Atomic Time" in every home and office. However, acceptance of highly accurate and automatically set time appliances is greatly dependent upon cost and ease in implementation. Integrated circuit technologies have reduced the cost of time measurement, recording and display systems, e.g., digital clocks, parking meters, etc. However, complex and expensive receiving equipment is presently used to receive the time signals from the NIST radio stations. Apparatus and systems requiring accurate time information may be for example, but not limited to, clocks, time of use utility meters, traffic lights; bus, train and plane scheduling apparatus; speed measuring instruments used in combination with global positioning satellite (GPS) devices, timers, parking meters, and the like.

Existing super-regenerative receivers use controlled quenching that introduce unwanted noise into the resonant tank circuit of the super-regenerative receiver, thus reducing the ultimate sensitivity of the receiver. In addition, the sensitivity of the super-regenerative receiver is non-linear due to the controlled quenching. Alternatively, super-regenerative receivers require a large number of active and passive devices to realize a practical and sensitive solution which is both expensive and difficult to implement in an integrated circuit.

In addition, implementation of a low frequency (LF) reception super-regenerative receiver is problematic in that the quench frequency and the carrier frequency are relatively close to one another, leading to difficulties in designing for reduced cross modulation (distortion), and thus unwanted noise. Another problem with LF passive quenching is the large capacitor and inductor values required for implementation, these components take up space and increase cost. Super-regenerative receivers also have the unwanted characteristic that the quenching action radiates unwanted noise and thereby causes other super-regenerative receivers to "hear" one another when placed in close proximity.

Known regenerative receivers change the bias level to obtain the quench action, this results in the effective quality factor (hereinafter "Q") of the tank circuit to continuously change, and that the Q is low during the critical startup phase of the tank circuit. A high Q is desired at startup when "sampling" the incoming radio signal, having a low Q results in the existing regenerative receivers being noisy because they receive wide bandwidth (low Q tank circuit) noise during startup. Another disadvantage of known regenerative receivers is that with a varying bias, the effective receiver bandwidth (Q) changes with signal strength and thus noise performance can worsen when receiving weak signals.

U.S. Pat. No. 5,630,216 makes use of controlled quenching by means of a decaying current source that is realized by a square wave source and a pulse forming networking consisting of two capacitors where $I=C\,dv/dt$. This approach introduces unwanted noise due to the high dv/dt square wave source, the author ties to solve this problem with excessive filtering but the ultimate sensitivity is limited. The solution addresses the noise emission problem by de-coupling the tank and the receiver sections and not limiting by limiting the oscillation amplitude. U.S. Pat. No. 6,035,002 adjusts the biasing level of the receiver tank to alter the start up time of the regenerative oscillator, the time is then compared to a reference signal to determine whether start-up is faster or slower than expected. The solution makes use of a number of active stages and the biasing and control circuitry that induces noise into the receiver and thus reduces the ultimate sensitivity. The solution addresses the noise emission problem by de-coupling the tank and the receiver sections with an active buffer.

Therefore, what is needed is a low cost and sensitive super-regenerative receiver that can be easily fabricated in an integrated circuit.

SUMMARY OF THE INVENTION

The invention overcomes the above-identified problems as well as other shortcomings and deficiencies of existing technologies by providing a super-regenerative receiver that uses controlled Q-quenching and limits the resonant tank circuit amplitude by loading the tank as soon as oscillation is detected.

A low frequency super-regenerative receiver may provide a demodulated envelope of a received time signal to a digital processor. The digital processor may decode this demodulated signal to produce the time information. In addition, the digital processor may control the characteristics, e.g., tuning, gain control, etc., of the low frequency super-regenerative receiver to further improve reception performance thereof.

The present invention is directed to a super-regenerative receiver comprising an oscillator with a resonant tank circuit (e.g., magnetic inductive coil and capacitor(s)). The oscillations of the super-regenerative receiver are quenched by loading the inductive coil of the resonant tank circuit so as to stop the oscillations in a decaying manner. The resonant tank circuit is thereafter released (Q unloaded) to allow the oscillations to begin again. The startup time for the oscillations may be inversely proportional to the received signal strength. The oscillator tank circuit may be used as a signal pickup coil (antenna). The resonant tank circuit coil may be loaded with a resistor connected in series with a transistor switch. One terminal of the transistor switch may be connected to a radio frequency ground and the other terminal connected to one end of the loading resistor. Thus, the transistor switch may be controlled without requiring expensive opto-electric or radio frequency isolation. A signal detection circuit is coupled to the output of the super-regenerative receiver oscillator and may have detected signal information as a function of frequency or as serial digital information. A radio frequency amplifier may be used between a receiving antenna coil and the super-regenerative oscillator circuit for reducing radiated oscillations and noise. A digital processor may also control a tuning network coupled to the oscillator tank circuit so as to improve the reception sensitivity of super-regenerative receiver.

The quenchable oscillator of present invention uses fixed biasing that results in a constant and consistently high Q tank circuit after the quench is removed, thus the super-regenerative receiver, according to the present invention, has much better noise performance for the reception of both weak and strong signals. In addition, the super-regenerative receiver, of the present invention a substantially linear Q of the tank circuit with widely varying signal strengths. Thus super-regenerative receiver of the present invention has much wider dynamic range with better minimum sensitivity because the Q of the tank circuit and thus bandwidth is maintained for very weak signals. Bias control design is also simplified because large signal response may be used to predict small signal response. By measuring the rise time from, for example, a 10 mV tank voltage to a 20 mV tank voltage allows easy calculation of the receiver tank circuit Q. The bias may be adjusted until a desired tank circuit Q is obtained, thus the tank circuit Q that is determined for a large signal is also the Q for a small signal due to the linear behavior of the tank circuit Q of the invention.

The present invention may be fabricated in one or more integrated circuit dice un-packaged on a leadframe or substrate, or encapsulated in a plastic, epoxy and/or ceramic integrated circuit package, e.g., PDIP, SOIC, MSOP, TSSOP, QSOP and the like.

A technical advantage of the present invention is reduced quench noise. Another technical advantage is maximum sensitivity at the onset of oscillation. Another technical advantage is fixed biasing of the active amplifier circuit. Another technical advantage is substantially linear Q with varying signal strength. Another technical advantage is a fixed and limited oscillator amplitude. Still another technical advantage is a variable frequency output. Yet another technical advantage is no multiplication of control noise through the active amplifier circuit. Another technical advantage is the quench switch is referenced to a low impedance (radio frequency grounded) power supply rail, thereby not requiring optical or radio frequency isolation. Another technical advantage is using a physically small magnetic coil antenna resonant in the low frequency and medium frequency reception bands. Another technical advantage is fabricating the receiver in an integrated circuit. Still another technical advantage is adding input buffering stages so as to further reduce radiated noise from the receiver circuit. Another technical advantage is low power operation. Yet another technical advantage is efficient detection of digitally modulated data signals, e.g., WWVB. Yet another technical advantage is a low cost integrated circuit solution for apparatus and systems requiring precise time.

Features and advantages of the invention will be apparent from the following description of the embodiments, given for the purpose of disclosure and taken in conjunction with the accompanying drawing.

BRIEF DESCRIPTION OF THE DRAWING

A more complete understanding of the present disclosure and advantages thereof may be acquired by referring to the following description taken in conjunction with the accompanying drawing, wherein.

While the present invention is susceptible to various modifications and alternative forms, specific exemplary embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Referring now to the drawings, the details of exemplary embodiments of the present invention are schematically illustrated. Like elements in the drawing will be represented by like numbers, and similar elements will be represented by like numbers with a different lower case letter suffix.

Figure 1:
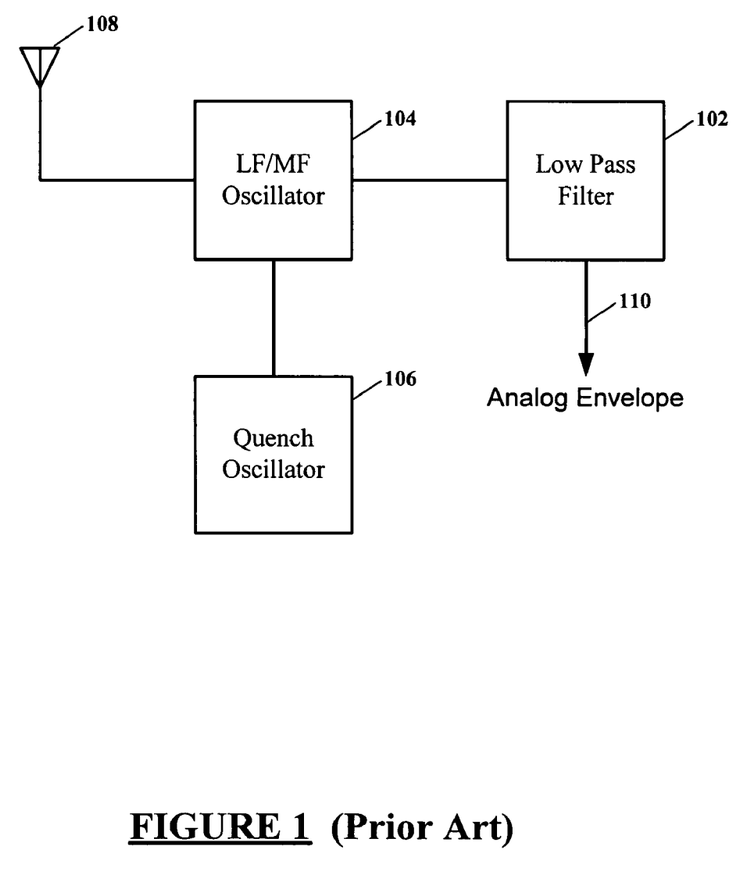
FIG. 1 illustrates schematic block diagram of a prior art super-regenerative receiver.

Referring to FIG. 1, depicted is a schematic block diagram of prior art super-regenerative receiver. Regenerative detectors are basically oscillators to which an input signal has been coupled. In a straight regenerative circuit, the input signal is coupled to the detector and then "regenerated" to very high levels by feeding back in phase a portion of the output signal of the detector to the input of the detector, until just before or just at a critical point where a self sustaining oscillation begins. A super-regenerative receiver uses an oscillating regenerative detector that is periodically shut off or "quenched." Super-regeneration allows the received signal to be regenerated over and over again, providing single-stage gains of close to one million. The oscillator of the super-regenerative receiver must be completely quenched each time before starting up again. Super-regenerative receiver/detectors can use either a separate lower frequency oscillator to interrupt the regenerative detector (separately quenched) or a single active circuit may be used to produce both oscillations (self-quenched circuit). The quench oscillator modulates the regenerative receiver/detector oscillator which drives the regenerative receiver/detector oscillator through the point of oscillation, maximum gain and sensitivity at a rate higher than the desired demodulated information rate (frequency). This results in a baseband demodulated signal that is free of the audible heterodynes that a regenerative receiver would produce. Thus, a super-regenerative receiver is useful for reception of amplitude modulated (AM) and frequency modulated (FM) signals.

When a super-regenerative receiver is used for low frequency reception, e.g., 60 kHz, a problem exists in that the quench frequency and carrier frequency are relatively close to one another, leading to difficulties in design for reducing distortion and unwanted noise. Another inherent problem with low frequency passive quenching is the large capacitor and inductor values required to implement a solution. These passive parts take up space and increase cost. The super-regenerative receiver has an undesirable characteristic in which the quenching action radiates unwanted noise that may cause other receivers in close proximity thereto to "hear" the super-regenerative receiver.

The prior art super-regenerative receiver depicted in FIG. 1 comprises an oscillator/detector 104 and a quench oscillator 106. The oscillator/detector 104 is coupled to an antenna 108 for reception of a desired radio frequency signal. The quenched oscillator/detector 104 output is coupled to a low pass filter 102 which substantially removes the radio frequency oscillations of the oscillator/detector 104 and the quench oscillator 106. The output 110 of the low pass filter 102 is an analog envelope of the radio frequency signal received at the antenna 108. For a more detailed analysis of integrated circuit radio frequency receiver design, see Lee, Thomas H., "The Design of CMOS Radio-Frequency Integrated Circuits," Cambridge University Press, 1998, which is hereby incorporated by reference herein for all purposes.

Figure 2:
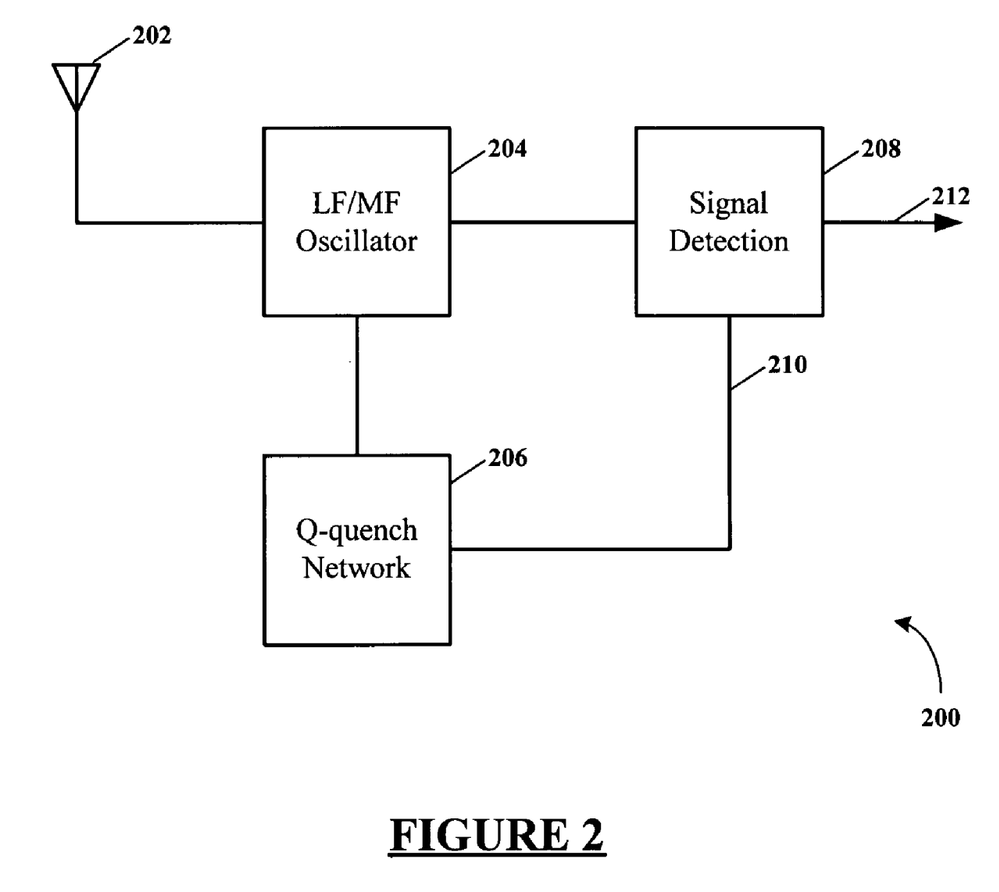
FIG. 2 illustrates a schematic block diagram of a super-regenerative receiver, according to an exemplary embodiment of the present invention.

Referring to FIG. 2, depicted is a schematic block diagram of a super-regenerative receiver, according to an exemplary embodiment of the present invention. The super-regenerative receiver, generally represented by the numeral 200, comprises an oscillator 204, a Q-quench network 206 and a signal detection circuit 208. The oscillator 204 operates at approximately the frequency of interest, e.g., 60 kHz. The Q-quench network 206 is coupled to the oscillator 204 and stops the oscillator 204 from operating whenever a control signal 210 is asserted from the signal detection circuit 208. The signal detection circuit 208 detects the presence of a signal from the oscillator 204. The output of the signal detection circuit 208 may be a variable frequency proportional to bandwidth of a tank circuit. The output of the signal detection circuit 208 may also be a series of amplitude pulses derived from the received time signal. Digitally controlled fixed quench periods may be used for detection of amplitude modulated signals.

The oscillator 204 is coupled to a receiving antenna 202 for reception of a desired radio frequency signal, e.g., WWVB. The receiving antenna 202 may be part of a frequency determining tuned circuit of the oscillator 204. Thus, the super-regenerative receiver 200 uses controlled Q-quenching and limits the oscillator 204 tank circuit amplitude by loading the tank circuit with the Q-quench network 206, as soon as oscillation is detected. In addition, the Q-quench network 206 may continue to load the tank circuit of the oscillator 204 for a certain period of time so as to insure that oscillation of the tank circuit has totally ceased. This substantially reduces radiated noise, improves received signal sensitivity and lowers power consumption.

Figure 3:
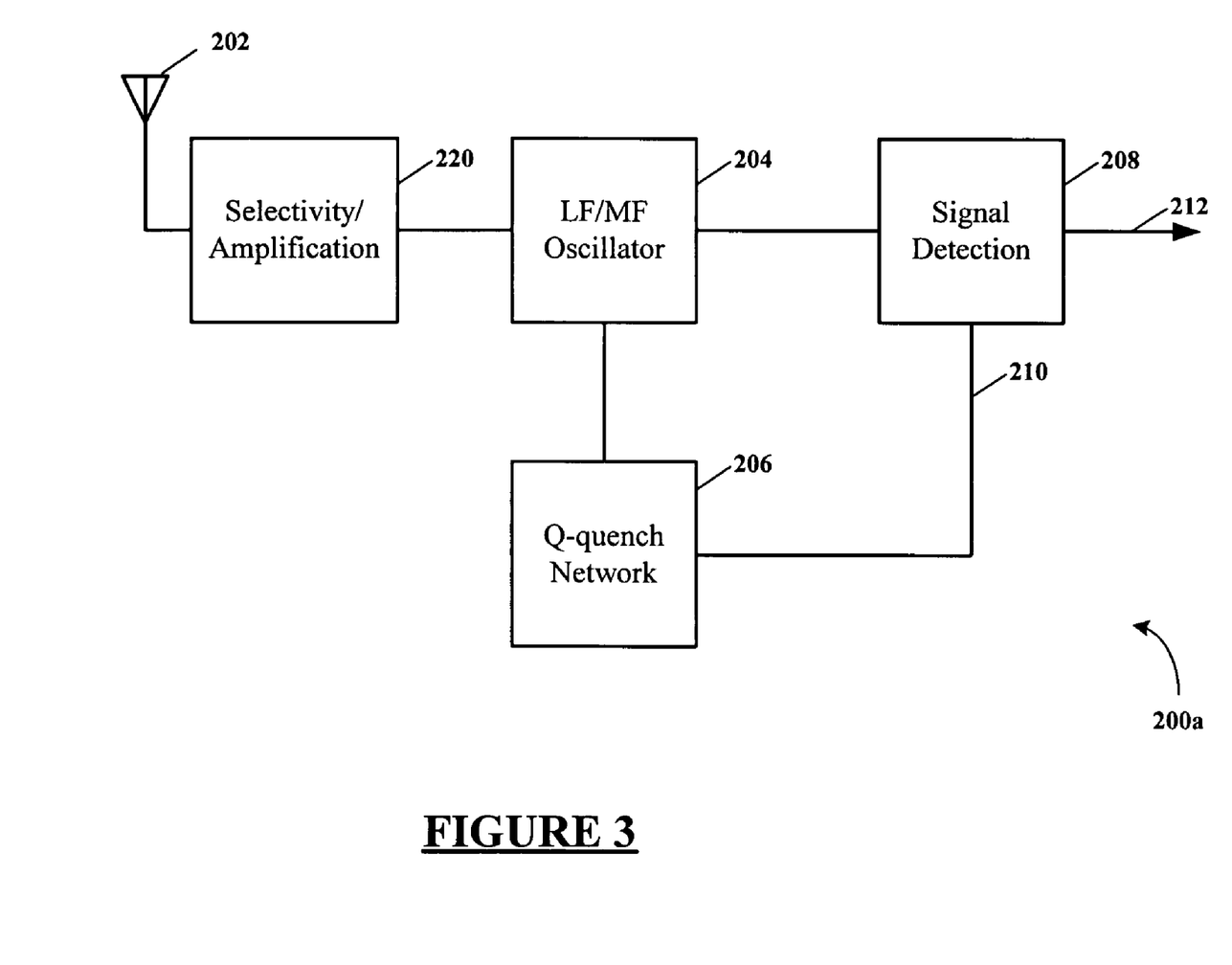
FIG. 3 illustrates a schematic block diagram of a super-regenerative receiver having additional input selectivity and/or amplification, according to another exemplary embodiment of the present invention.

Referring to FIG. 3, depicted is a schematic block diagram of a super-regenerative receiver having additional input selectivity and/or amplification. The selectivity and/or amplification circuit 220 may be used to improve the sensitivity and/or sensitivity of the super-regenerative receiver 200a. The selectivity and/or amplification circuit 220 may also reduce radiated noise from the LF/MF oscillator 204.

Figure 4:
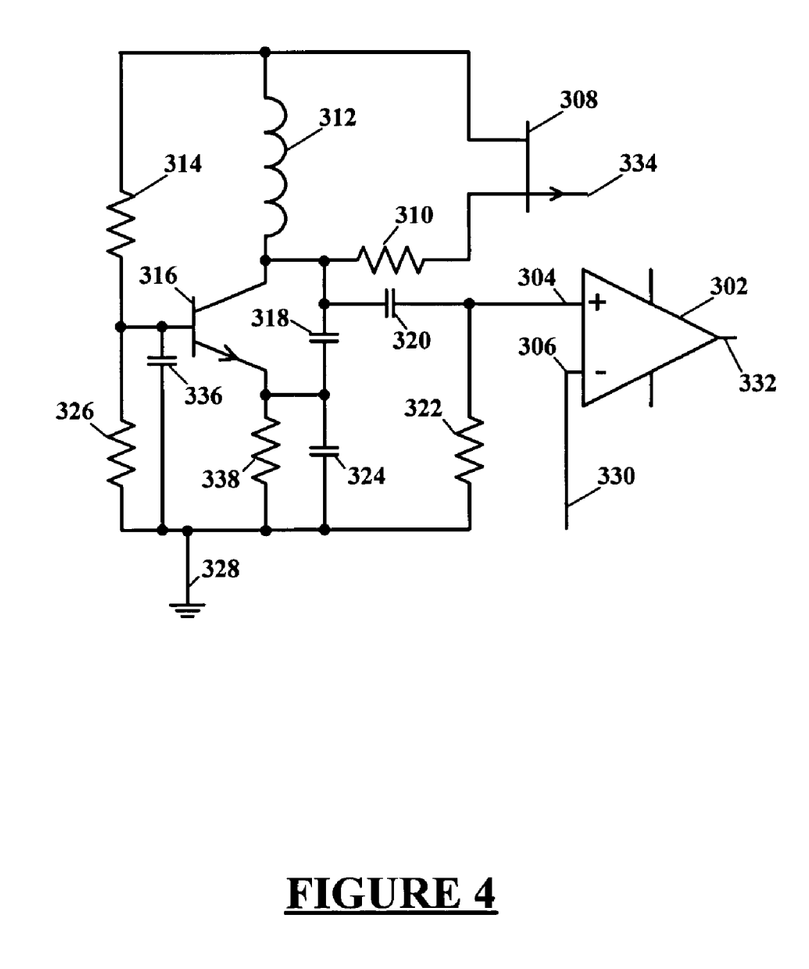
FIG. 4 illustrates a schematic diagram of an exemplary circuit implementation of the super-regenerative receiver block diagram depicted in FIG. 2.

Referring to FIG. 4, depicted is a schematic diagram of an exemplary super-regenerative receiver, according to the present invention. The oscillator 204 of FIG. 2 comprises transistor 316, coil 312 and capacitors 318 and 324. The Q-quench network 206 comprises transistor 308 and resistor 310. The signal detection circuit 208 comprises operational amplifier 302. Coil 312 and capacitors 318 and 324 form a resonant tank circuit, configured as a Colpitts oscillator circuit. Resistors 314, 326 and 338 are for direct current (DC) biasing of the transistor 316 in operation as the oscillator 204. Thus, the operating DC bias of the oscillator 204 may be at a fixed value determined by the resistors 314, 326 and 338.

The operational amplifier 302 input 304 is coupled to the an output node of the transistor 316 (oscillator 204) through a coupling capacitor 320. A voltage reference (not shown) may be used at input 330 of the operational amplifier 302. Whenever a voltage at input 304 is greater than the reference voltage at input 306 the output 332 of the operational amplifier 302 may go to a positive voltage rail since the gain of the operational amplifier 302 is very high. The operational amplifier 302 may also be a comparator having either a first logic level, e.g., high or low, when the voltage on the input 304 is greater than the voltage on the input 306, or second logic level, e.g., low or high, when the voltage on the input 304 is less than or equal to the voltage on the input 306. The output 332 may be coupled to the input 334 of the transistor 308 such that when a signal from the transistor 316 is at an amplitude that exceeds the voltage reference 330 at the input 306, the transistor 308 is turned on, thus connecting the Q-quench resistor 310 across the coil 312. This "loading" of the coil 312 (inductor) effectively quenches any oscillation that is beginning in the circuit. Thus, the super-regenerative receiver is quenched by loading the resonant tank coil 312 to stop oscillations in a decaying manner. Once the oscillations cease, the signal at the input 304 is less than the reference voltage 330 at input 306 and the transistor 308 may turn off, disconnecting the resistor 310 from loading the coil 312. Thus, the resonant tank coil 312 is thereafter "released" or Q-unloaded to allow oscillations to begin again. Q-unloading ("release") of the resonant tank coil 312 may be briefly delayed so as to reduce switch noise from the transistor 308 being coupled into the super-regenerative receiver 200. The release delay also ensures that the resonant tank coil 312 stops oscillating. Furthermore, digitally controlled fixed quench periods may be used to produce a detected amplitude modulated signal.

The coil 312 may further function as an antenna (e.g., antenna 202 of FIG. 2) for receiving radio frequency signals. For low and medium frequency signals a magnetic coil antennas may be used for the coil 312. Magnetic coil antennas are electrically very small. The received signal contributes to the signal level at the output of the transistor 316 (input 304), and is a regenerative combination of the start-up of oscillations and the received signal strength. Thus, the start-up time of oscillations is inversely proportional to the strength of the signal received at the coil 312. Optionally, a low level signal may be fed into the base of transistor 316 when bypass capacitor 336 is removed, e.g., from an antenna or amplifier. Advantages of this super-regenerative circuit are easy quench control, lower noise floor, low power, very sensitive signal reception, easy to implement in an integrated circuit, and therefor low cost. The circuit may be referenced (connected) to ground 328.

The circuit depicted in FIG. 4 of the super-regenerative receiver may be easily and economically fabricated on an integrated circuit die.

Figure 5:
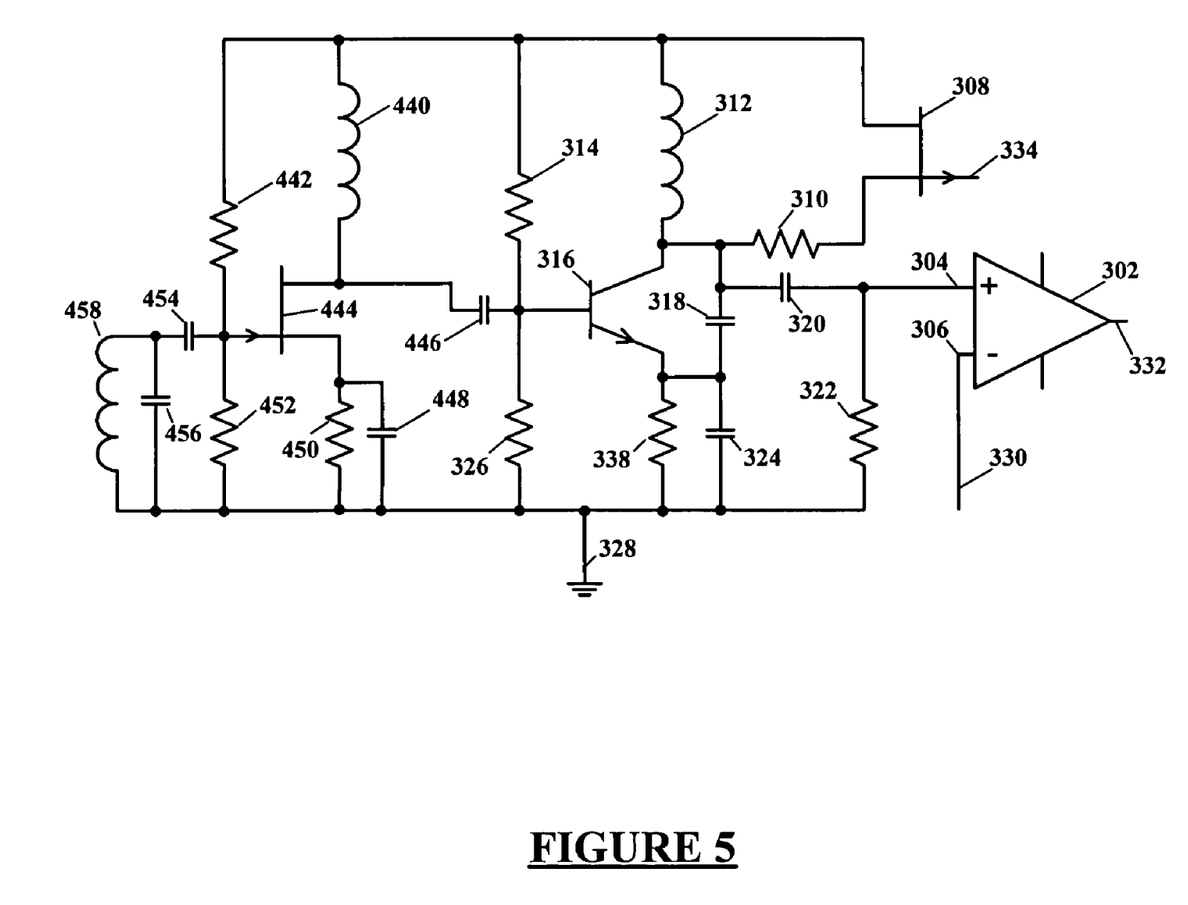
FIG. 5 illustrates a schematic diagram of the super-regenerative receiver of FIG. 4 and a radio frequency amplifier.

Referring now to FIG. 5, depicted is a radio frequency amplifier added to the exemplary circuit implementation of the super-regenerative receiver of FIG. 4. The radio frequency amplifier comprises transistor 444, radio frequency tank coil 440 and input antenna coil 458. A radio station of interest, e.g., WWVB, has a radio frequency signal that is received by the antenna coil 458 and coupled to the gate of the transistor 444 through coupling capacitor 454. Capacitor 456 may be used in combination with the antenna coil 458 to form a parallel resonant circuit at a frequency of interest, e.g., 60 kHz (WWVB). The received signal from the antenna coil 458 is amplified in the transistor 444 and the amplified received signal is coupled to the super-regenerative oscillator transistor 316 through coupling capacitor 446. Resistors 442, 452 and 450 are biasing resistors for operation of the transistor 444. Capacitor 448 is a bypass (R.F. short) at the received signal frequency. This exemplary embodiment produces higher gain and better sensitivity than the circuit of FIG. 4 (without the radio frequency amplifier). Another advantage of this embodiment is better selectivity for interfering signals and a reduction in radiated noise signals produced from the quenched super-regenerative oscillator. The circuit depicted in FIG. 5 of the super-regenerative receiver may be easily and economically fabricated on an integrated circuit die.

Figure 6:
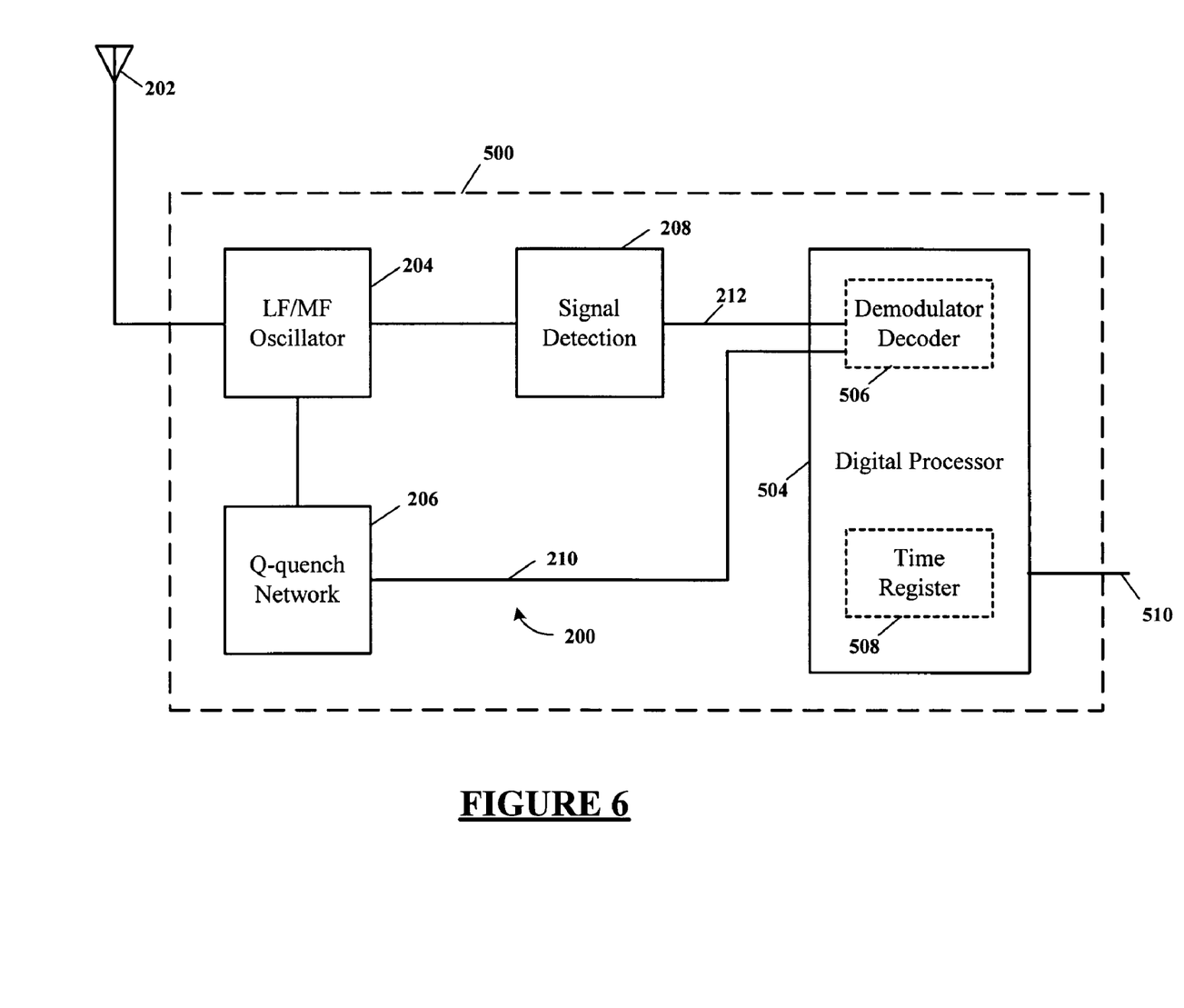
FIG. 6 illustrates a schematic block diagram of a receiver time information processor, according to an exemplary embodiment of the present invention.

Referring to FIG. 6, depicted is a schematic block diagram of a time signal processor according to an exemplary embodiment of the present invention. The time signal processor, generally represented by the numeral 500, comprises a super-regenerative receiver 200 and a digital processor 504. The super-regenerative receiver 200 comprises an oscillator 204, a Q-quench network 206 and a signal detection circuit 208. The signal detection circuit has an output 212 that is coupled to a demodulator/decoder 506 that may be part of the digital processor 504. The demodulator/decoder 506 may control the Q-quench network 206 with a control signal 210. The control signal 210 may have a release delay so that the Q-quench network 206 ensures that oscillator 204 stops oscillating. The control signal 210 may be digitally controlled to produce fixed quench periods that may be used to produce a detected amplitude modulated signal with the demodulator/decoder 506.

The demodulator/decoder 506 may further demodulate frequency modulated time signal information and/or amplitude modulated time signal information and may store this time information into a time register 508. A time output 510 from the digital processor 504 may be available for use by an apparatus and/or system (not illustrated) requiring accurate time information. The digital processor 504 may be for example but not limited to: a microcontroller, a microprocessor, a programmable logic array (PLA), an application specific integrated circuit (ASIC), a digital signal processor (DSP), and the like. The circuit depicted in FIG. 6 may be easily and economically fabricated on one or more integrated circuit dice.

Figure 7:
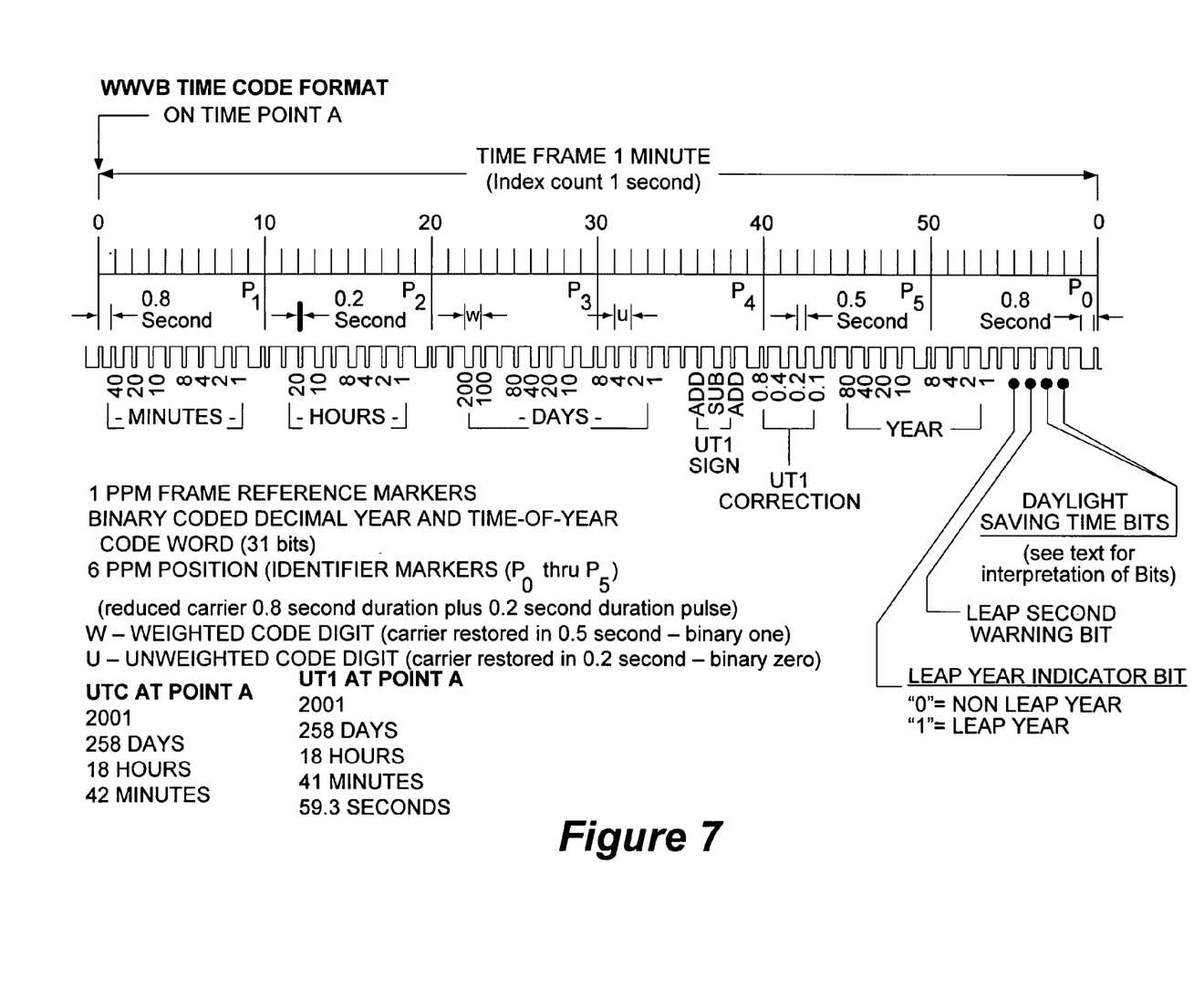
FIG. 7 illustrates the WWVB time code format.

Referring to FIG. 7, depicted is the WWVB time code format. The super-generative receiver 200 receives the WWVB time coded signal at 60 kHz and demodulates this amplitude modulated (AM) digital time code format. The demodulated WWVB time code format is applied to the digital decoder 502 which detects the demodulated pulse amplitudes and timing of the pulses. It is contemplated and within the scope of the present invention that higher frequency time coded signals, e.g., WWV and WWVH, may also be used with appropriate tuning of the frequency and demodulation determining circuits.

The present invention may be fabricated in one or more integrated circuit dice un-packaged on a leadframe or substrate, or encapsulated in a plastic, epoxy and/or ceramic integrated circuit package, e.g., plastic dual in-line package (PDIP), small outline integrated circuit (SOIC), mini small outline package (MSOP), thin shrink small outline package (TSSOP), and quarter size outline package (QSOP) and the like.

The invention, therefore, is well adapted to carry out the objects and attain the ends and advantages mentioned, as well as others inherent therein. While the invention has been depicted, described, and is defined by reference to exemplary embodiments of the invention, such a reference does not imply a limitation on the invention, and no such limitation is to be inferred. The invention is capable of considerable modification, alternation, and equivalents in form and function, as will occur to those ordinarily skilled in the pertinent arts and having the benefit of this disclosure. The depicted and described embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. A super-regenerative receiver, comprising:
a quenchable oscillator, said quenchable oscillator having a tuned circuit approximately resonant at a frequency of a desired signal and a signal output;
a quench circuit having a control input with first and second logic states, said quench circuit being coupled to the tuned circuit of said quenchable oscillator when the control input is in the first logic state, and said quench circuit being decoupled from the tuned circuit of said quenchable oscillator when the control input is in the second logic state; and
a signal detection circuit, said signal detection circuit having an input coupled to the signal output of said quenchable oscillator and a control output coupled to the control input of said quench circuit, wherein if a signal level from the signal output is greater than a certain value then the control output of said signal detection circuit is at the first logic level and if the signal level from the signal output is equal to or less than the certain value then the control output of said signal detection circuit is at the second logic level.

2. The super-regenerative receiver of claim 1, wherein the tuned circuit is used as an antenna for reception of the desired signal.

3. The super-regenerative receiver of claim 1, wherein an antenna for reception of the desired signal is coupled to said quenchable oscillator.

4. The super-regenerative receiver of claim 1, further comprising an amplifier having radio frequency selectivity, said amplifier coupled to said quenchable oscillator.

5. The super-regenerative receiver of claim 4, wherein the radio frequency selectivity of said amplifier is used as an antenna for reception of the desired signal.

6. The super-regenerative receiver of claim 4, wherein said amplifier is coupled to an antenna for reception of the desired signal.

7. The super-regenerative receiver of claim 1, wherein said quenchable oscillator is a Colpitts oscillator circuit.

8. The super-regenerative receiver of claim 1, wherein said quench circuit is a resistor in series with a switch.

9. The super-regenerative receiver of claim 8, wherein the switch is a transistor coupled between a radio frequency ground and the resistor.

10. The super-regenerative receiver of claim 1, wherein said signal detection circuit is an operational amplifier having a first input coupled to the signal output of said quenchable oscillator and a second input coupled to a voltage reference of the certain value.

11. The super-regenerative receiver of claim 1, wherein said signal detection circuit is a comparator having a first input coupled to the signal output of said quenchable oscillator and a second input coupled to a voltage reference of the certain value.

12. The super-regenerative receiver of claim 1, wherein said quenchable oscillator has a direct current (DC) bias point that is fixed.

13. The super-regenerative receiver of claim 1, wherein the control input is delayed when going from the first logic state to the second logic state.

14. The super-regenerative receiver of claim 1, further comprising a digital processor for digitally controlling the quench circuit.

15. The super-regenerative receiver of claim 14, wherein said quench oscillator, said quench circuit, said signal detection circuit and said digital processor are fabricated on at least one integrated circuit die.

16. The super-regenerative receiver of claim 15, further comprising packaging said at least one integrated circuit die in an integrated circuit package.

17. The super-regenerative receiver of claim 16, wherein the integrated circuit package is selected from the group consisting of plastic dual in-line package (PDIP), small outline integrated circuit (SOIC), mini small outline package (MSOP), thin shrink small outline package (TSSOP), and quarter size outline package (QSOP).

18. The super-regenerative receiver of claim 1, wherein the digitally controlled quench circuit is used to demodulate an amplitude modulated signal.

19. The super-regenerative receiver of claim 1, wherein the control input is delayed when going from the second logic state to the first logic state.

20. The super-regenerative receiver of claim 1, wherein a quality factor (Q) of the tuned circuit is substantially constant.

21. The super-regenerative receiver of claim 1, wherein the quenchable oscillator has substantially fixed bias.

22. The super-regenerative receiver of claim 1, wherein a quality factor (Q) of the tuned circuit is substantially linear for substantially all received signal strengths.

23. A method for receiving a signal with a super-regenerative receiver, said method comprising the steps of:
providing a quenchable oscillator having a tuned circuit approximately resonant at a frequency of a desired signal and a signal output of the quenchable oscillator;
providing a quench circuit for quenching oscillations of the quenchable oscillator;
detecting a signal level from the quenchable oscillator wherein
if the detected signal level is greater than a certain value then coupling the quench circuit to the tuned circuit of the quenchable oscillator, and
if the detected signal level is less than or equal to the certain value then decoupling the quench circuit from the tuned circuit of the quenchable oscillator.

24. The method of claim 23, further comprising the step of delaying decoupling of the quench circuit from the tuned circuit of the quenchable oscillator.

25. The method of claim 23, further comprising the step of fine tuning the tuned circuit to the frequency of the desired signal.

26. The method of claim 23, further comprising the step of fabricating on an integrated circuit the quenchable oscillator, the quench circuit and a circuit for detecting the signal level.

27. The method of claim 23, further comprising the step of digitally controlling the quench circuit for detecting an amplitude modulated signal.

28. The method of claim 23, wherein a quality factor (Q) of the tuned circuit is substantially constant.

29. The method of claim 23, wherein the quenchable oscillator has substantially fixed bias.

30. The method of claim 23, wherein a quality factor (Q) of the tuned circuit is substantially linear for substantially all received signal strengths.

* * * * *